(12) United States Patent
Confalonieri et al.

(10) Patent No.: US 6,433,724 B1
(45) Date of Patent: Aug. 13, 2002

(54) ANALOG-DIGITAL CONVERTER WITH SINGLE-ENDED INPUT

(75) Inventors: Pierangelo Confalonieri, Milan; Angelo Nagari, Pavia; Alessandro Mecchia, Milan, all of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/533,015

(22) Filed: Mar. 22, 2000

(30) Foreign Application Priority Data

Mar. 24, 1999  (EP) .............................................. 99830170

(51) Int. Cl.[7] .............................................. H03M 1/12
(52) U.S. Cl. ...................................... 341/155; 341/156
(58) Field of Search ................................ 341/155, 156, 341/144, 172, 134, 150, 122; 340/347

(56) References Cited

U.S. PATENT DOCUMENTS

| | | | |
|---|---|---|---|
| 4,709,225 A | * 11/1987 | Welland et al. | 340/347 |
| 5,581,252 A | * 12/1996 | Thomas | 341/144 |
| 5,621,409 A | * 4/1997 | Cotter et al. | 341/156 |

* cited by examiner

*Primary Examiner*—Peguy JeanPierre
*Assistant Examiner*—Joseph Lauture
(74) *Attorney, Agent, or Firm*—Lisa K. Jorgenson; Allen, Dyer, Doppelt, Milbrath & Gilchrist, P.A.

(57) ABSTRACT

A set of sampling capacitors weighted according to a binary code is charged through a first capacitive unit, whose capacitance is equal to the sum of the capacitances of the set, at a voltage Vcm−Vin/2. The conversion is carried out by an SAR process by a comparator and a logic unit which operates the switches associated with the capacitors. The final position of the switches is loaded into a register which supplies the digital output signal. To prevent any disturbances in the power supply and reference potential sources from affecting the accuracy of the conversion, two further capacitive units are provided, with the same capacitance as the first capacitive unit. These make it possible to prevent all the disturbances at the input of the comparator in common mode and therefore without any effect on the output.

17 Claims, 4 Drawing Sheets

ANALOG-DIGITAL CONVERTER WITH SINGLE-ENDED INPUT

FIELD OF THE INVENTION

The present invention relates to signal conversions, and, more particularly, to analog/digital (A/D) converters.

BACKGROUND OF THE INVENTION

Analog signals have to be converted to digital signals in many kinds of electronic equipment. A significant example of this type of equipment is provided by digital cellular telephones. In these applications, the requirements of low consumption and high performance impose particularly severe constraints on the design of the integrated circuits which form the electronic system of the equipment.

One type of A/D converter which is particularly advantageous for use in these electronic systems will be generally described below, and which makes use of binary code weighted capacitors with associated switches which are controlled by a logic circuit by a process known as SAR (Successive Approximations Register). To obtain a large dynamic field and a good immunity to noise originating either within or outside the integrated circuit, the circuit portions for analog processing of the signal are preferably formed from structures of the fully differential type.

In certain cases, however, analog signals which are not of the differential type, i.e. in the form of variations of voltage of opposite sign to a common reference potential, but are of the asymmetric or "single-ended" type, i.e. in the form of a single voltage variable with respect to a reference potential, are present and have to be converted into digital form. In these cases, there are two alternatives: either converters operating with single-ended input signals are used, or the signal is converted to a differential signal and then applied to a converter which operates with differential input signals. In the first case, it is necessary to make arrangements, where possible, to overcome the negative effects of noise and other limitations intrinsic to the processing of a single-ended signal, and in the second case it is necessary to allow for a higher power consumption and other undesired effects (distortion and offset) of the circuit to be connected before the converter.

SUMMARY OF THE INVENTION

An object of the present invention is to provide an A/D converter which carries out the conversion of a single-ended signal directly, and which has a noise immunity at least equal to that of a converter for differential signals.

This object is achieved according to the invention by an A/D converter having a set of sampling capacitors weighted according to a binary code and charged through a first capacitive unit, whose capacitance is equal to the sum of the capacitances of the set, at a voltage Vcm−Vin/2. The conversion is carried out by an SAR process by a comparator and a logic unit which operates the switches associated with the capacitors. The final position of the switches is loaded into a register which supplies the digital output signal. To prevent any disturbances in the power supply and reference potential sources from affecting the accuracy of the conversion, two further capacitive units and are provided. These have the same capacitance as the first capacitive unit, and these make it possible to present all the disturbances at the input of the comparator in common mode and therefore without any effect on the output.

BRIEF DESCRIPTION OF THE DRAWINGS

The invention will be more clearly understood from the following detailed description of two embodiments thereof, provided by way of example and therefore without restriction, and relating to the attached drawings, in which.

DETAILED DESCRIPTION OF THE PREFERRED EMBODIMENTS

For simplicity of representation, the figures show converters which convert an analog signal by sampling it with binary numbers having five bits only; clearly, however, converters with a larger bit number may be made in practice.

Figure 1:
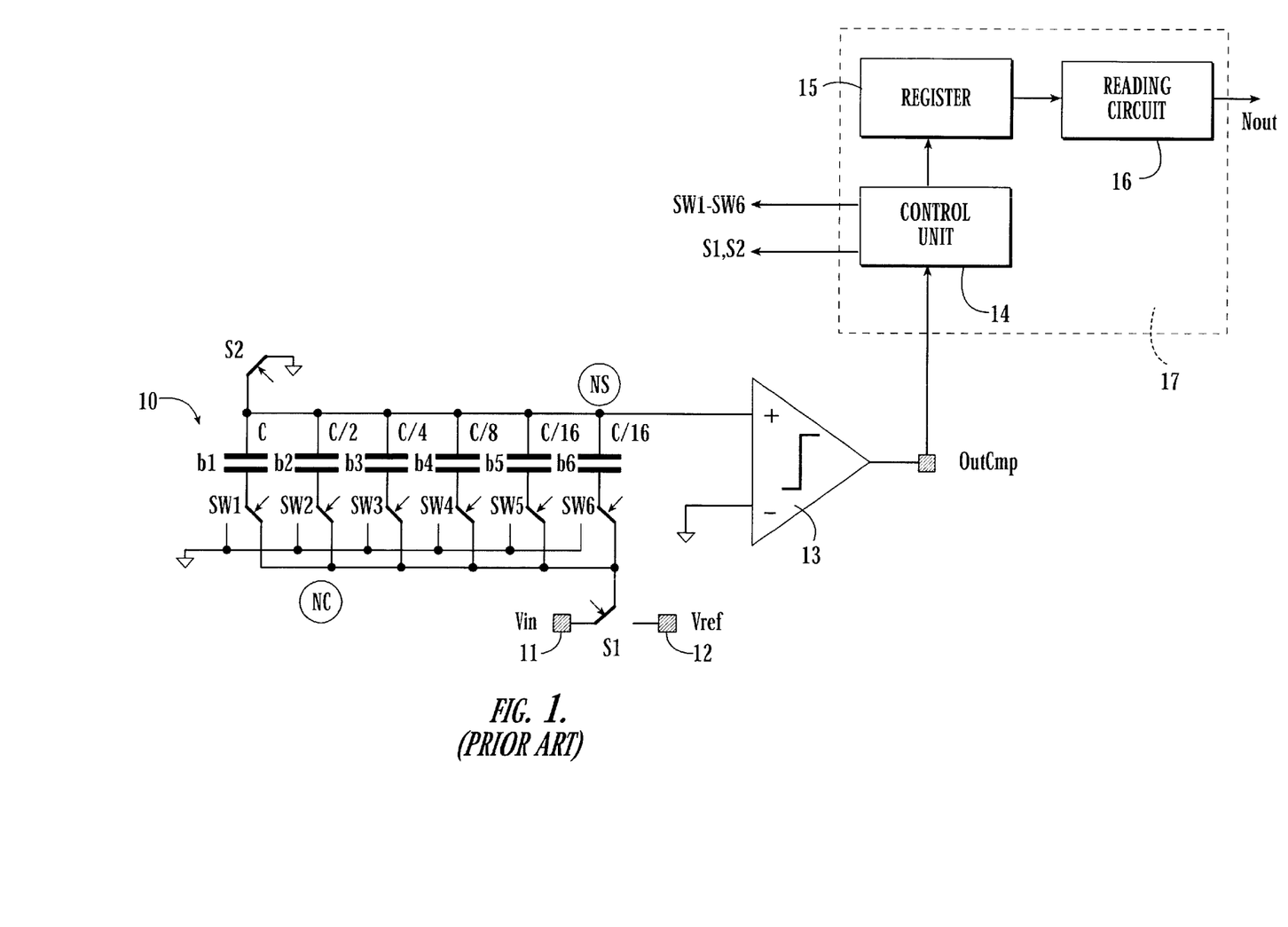
FIG. 1 shows an A/D converter of the known type for single-ended signals, operating by the SAR process.

The diagram in FIG. 1 shows a conventional A/D converter having a set 10 of six capacitors b1–b6, each of which is associated with a switch SW1–SW6. The capacitors b5 to b1 are weighted according to a binary code. In other words they have values of capacitance progressively increasing by a factor of 2 where i is variable from 0 to 4. The sixth capacitor b6, whose capacitance is equal to that of the capacitor b5, is used to ensure that the sum of the capacitances of the set is exactly twice the capacitance of the capacitor b1.

One electrode of each of the capacitors is connected to a common terminal NS. The switches are used to connect the other electrode of each of the capacitors selectively to a first terminal NC, or to a second terminal, indicated by the ground symbol. The terminal NS can be connected to ground or can be left unconnected via a cut-out switch S2. The terminal NC can be connected selectively, by a switch S1, to an input terminal 11 to which an input signal Vin (a voltage relative to ground) is applied, or to a reference terminal 12 on which a reference voltage Vref is present.

The terminal NS is connected to the non-inverting input terminal of an operational amplifier 13 which acts as a comparator. The inverting input terminal of the operational amplifier 13 is connected to ground. The output OutCmp of the comparator is connected to a processing, control and register unit, indicated as a whole by the number 17, which comprises a controlling logic unit 14, a register 15 and a register reading circuit 16. More particularly, the output OutCmp is connected to the controlling logic unit 14 which, in turn, is connected to the switches SW1–SW6, to the cut-out switch S2 and to the switch S1 to operate them according to a predetermined timing program and in accordance with the output of the comparator. It should be understood that, in practice, the switches and the cut-out switch include controllable electronic connecting devices, such as MOS transistors or combinations of MOS transistors. The logic unit 14 is also connected to the register 15 which is used to store the positions of the switches SW1–SW5. The register reading circuit 16 supplies at its output a digital signal Nout corresponding to the analog input signal Vin. A converter similar to that in FIG. 1 is described, for example, in "Analog MOS Integrated Circuits" by Gregorian and Temes, published by Wiley, pp. 420–425.

The operation of the converter is, briefly, as follows. In a first phase, the switches are operated by the logic unit 14 in such a way that their positions are as shown in FIG. 1, in other words with the terminal NC connected, through the switch S1, to the input terminal 11, to which is applied the signal Vin to be converted, with the terminal NS connected, through the cut-out switch S2, to ground, and with all the lower electrodes of the capacitors connected, through the switches SW1–SW6 associated with them, to the terminal NC, so that all the capacitors are charged at the voltage Vin (relative to ground). In the next phase, the logic unit 14 causes the cut-out switch S2 to open, and then causes the switches SW1–SW6 to be switched in such a way as to connect the lower electrodes of all the capacitors to ground, with the result that the common terminal NS of the set 10 goes to the voltage −Vin (relative to ground).

At this point, the logic unit 14 initiates the typical operations of the SAR process to identify, one after another, the values of the bits making up the binary number which represents the sample of the analog input voltage. More particularly, in order to find the most significant bit, the lower electrode of the capacitor b1 having the greatest capacitance (C) is connected to the terminal 12, which is at the reference voltage Vref, by the switching of the switches SW1 and S1. This causes the voltage on the terminal NS to increase from −Vin to −Vin+Vref/2. The reference voltage Vref is selected so that its value is equal to the maximum convertible voltage Vin.

If the voltage −Vin+Vref/2 is negative, the comparator 13 will have a low signal at the output and the logic unit 14 will keep the switch SW1 in the position in which the lower electrode of the capacitor b1 is connected to the reference terminal 12 (Vref) and will transmit this position information in the form of a 1 bit to the register 15. Conversely, if the voltage −Vin+Vref/2 is positive, the comparator 13 will have a high signal at the output and the logic unit 14 will return the switch SW1 to the position in which the lower electrode of the capacitor b1 is connected to ground, and will transmit this position information in the form of a 0 bit to the register 15 as corresponding. The same operation is carried out for the capacitor b2 to find the second bit, and so on for all the remaining capacitors except the last, b6, which remains connected to ground throughout the SAR operations. At the end, the register 15 will contain five bits which represent the final positions of the switches SW1–SW5 and the binary code corresponding to the measurement of the sample of the input voltage Vin.

As mentioned initially, the operation of a single-ended A/D converter such as that described above may be negatively affected by noise. In this connection, it should be noted that the reference voltage Vref, which is usually generated by a circuit located on the same substrate as that on which the converter is formed, with other analog and digital circuits, is subject to disturbances of the power supply voltage and to those induced in the substrate by other circuits. It should also be noted that any noise present on the ground terminal in the instant in which the cut-out switch S2 is open remains stored on the terminal NS. Furthermore, the capacitance which the cut-out switch S2 (normally a MOS transistor) has with respect to the terminal NS, when the cut-out switch opens, is discharged, causing a change in the potential of the terminal NS (an effect known as feedthrough). This change gives rise to a conversion offset, in other words to a component not due to the input signal, which may adversely affect the accuracy of the conversion.

To overcome these problems, it has been proposed that the single-ended signal to be converted should be transformed into a differential signal and that the conversion should be carried out with a differential converter. A circuit structure which implements this known proposal is shown schematically in FIG. 2. The analog signal to be converted, indicated again by Vin, is applied to the input of a circuit 20 capable of transforming a single-ended input voltage into two differential output voltages +Vin and −Vin (in the figure, SE→FD signifies "from Single-Ended to Fully Differential"). In practice, the circuit 20 may include an operational amplifier with suitable feedback control.

Figure 2:
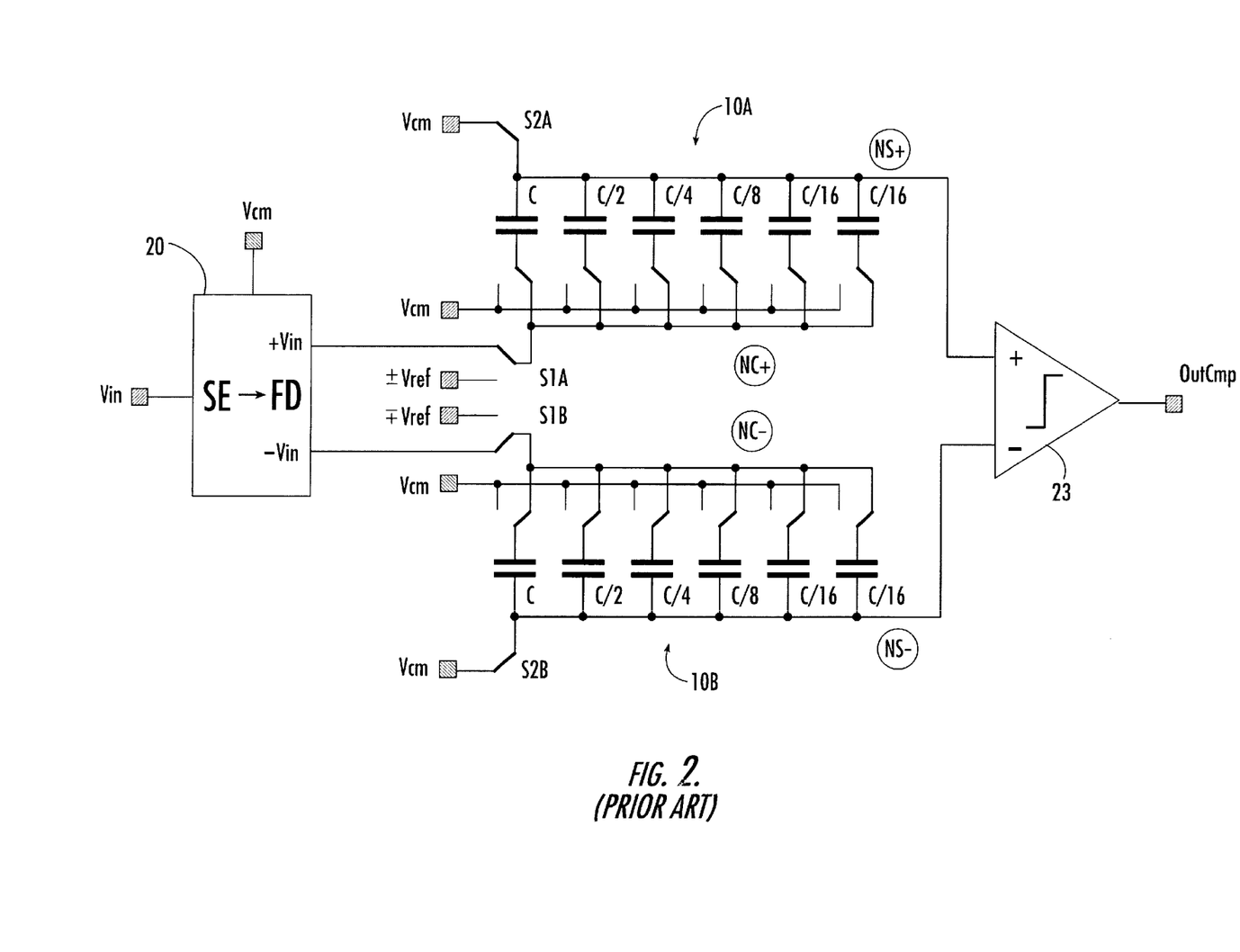
FIG. 2 is a diagram of a significant part of a known A/D converter for single-ended signals which uses a single-ended to differential conversion circuit and a differential A/D converter.

A voltage, known as the common-mode voltage, Vcm, is applied to the circuit 20 and forms the reference voltage of the differential output voltages +Vin and −Vin. The differential outputs +Vin and −Vin are applied, each through a switch S1A, S1B, to two sets of capacitors 10A and 10B, which are identical to the set 10 in FIG. 1, except for the fact that the terminals corresponding to the terminals connected to ground in the circuit in FIG. 1 are connected to the common-mode voltage Vcm and those corresponding to the terminal connected to the reference voltage Vref are at a differential reference voltage which has a positive value (+Vref) or a negative value (−Vref) with respect to the common-mode voltage Vcm. The common terminals NS+ and NS− of the two sets are connected to the non-inverting and inverting terminal respectively of a comparator 23 similar to the comparator 13 in FIG. 1.

A logic unit, not shown, controls the cut-out switches and the switches according to a program similar in all ways to that produced by the logic unit 14 in FIG. 1. It is only necessary to note that the cut-out switch and the switches of the set of capacitors 10A are operated simultaneously with the corresponding cut-out switch and the corresponding switches of the set of capacitors 10B, and that the reference voltages are applied in phase opposition. In other words, if a capacitor of the set 10A is at +Vref, the corresponding capacitor of the set 10B is at −Vref. A register and a register reading unit similar to those in FIG. 1 are also provided, but are not shown, in the converter shown in FIG. 2.

The converter described above makes it possible to obtain good noise immunity, since any noise superimposed on the common-mode voltage Vcm is stored in an identical way in both sets of capacitors 10A and 10B, and therefore the difference in voltage between the terminals NS+ and NS−, which are also the input terminals of the comparator, is not affected by the noise. Furthermore, during the phases of conversion by approximation by the SAR process, the number of capacitors of the set 10A connected to Vcm through the corresponding associated switches will be equal to the number of capacitors of the set 10B connected to Vcm, and the capacitors of the set 10A connected to +Vref or to −Vref will have their corresponding capacitors connected to −Vref or +Vref respectively. Since the reference voltage ±Vref is differential and the disturbances are common-mode, the disturbances present at Vcm and at Vref have no practical effect at all on the accuracy of the conversion.

However, the converter shown in FIG. 2 has certain disadvantages, due to the addition of the circuit 20 for transformation from single-ended to fully differential, which at least partly vitiate the advantages of the conversion to differential form. These disadvantages include a higher power consumption, distortion of the signal to be converted, and conversion offset.

Figure 3:
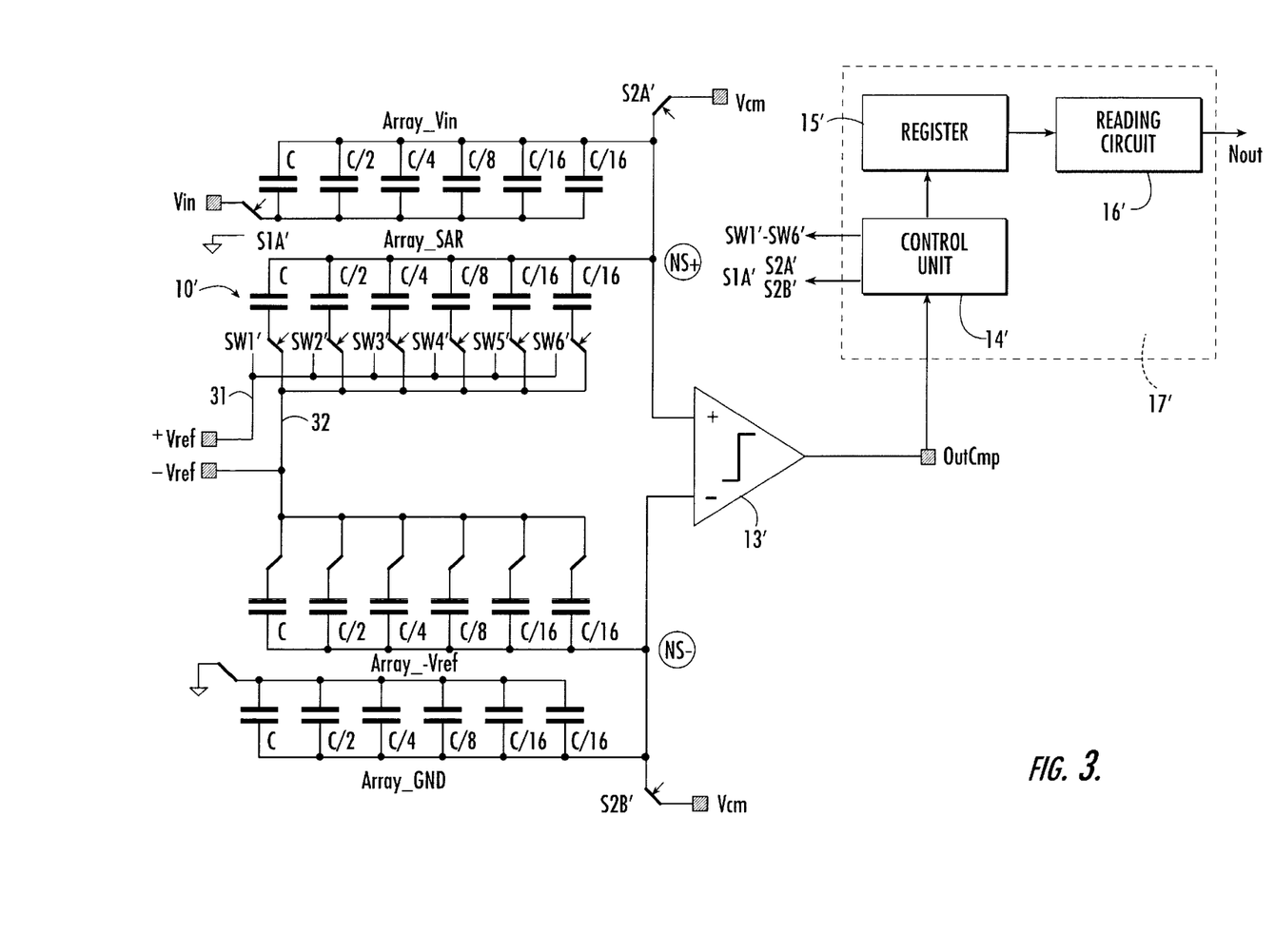
FIG. 3 is a diagram of an A/D converter for single-ended signals according to a first embodiment of the invention.

The A/D converter according to an embodiment of the present invention is shown in FIG. 3 and also has a set 10' of capacitors, also indicated by the expression Array_SAR, identical to the set 10 in FIG. 1, as well as a voltage comparator 13' and a processing, control and register unit 17' comprising a logic unit 14', a register 15' and a reading unit 16' as in the converter in FIG. 1, but has additional components which distinguish it from the latter in respect of structure and operation.

More particularly, the terminal NS+, corresponding to the terminal NS in FIG. 1, may be connected through a cut-out switch S2A' to a terminal of a source of common-mode reference voltage Vcm, instead of to the ground terminal as in the case shown in FIG. 1. Additionally, the capacitors of the set can be connected selectively, through the associated switches SW1'–SW6', to the terminals 31 and 32 of another source of reference voltages +Vref and −Vref, instead of between the ground and the terminal NC in FIG. 1. +Vref and −Vref are two differential reference voltages relative to the common-mode voltage Vcm. The input voltage Vin, relative to ground, is not applied to the set of capacitors 10' directly, as in the case of the set 10 in FIG. 1, but is applied indirectly, or more precisely through a switch S1A' and a capacitive unit indicated by Array_Vin in FIG. 3. This unit, in this embodiment, is formed by a set of six capacitors, identical to the capacitors of the set 10' but connected in parallel with each other.

Two other sets of capacitors, indicated by Array_GND and Array_Vref, and essentially identical to the set Array_Vin, are connected between the inverting terminal of the comparator 13', indicated by NS−, and, respectively, the reference terminal −Vref and the ground terminal. The terminal NS− can be connected through a cut-out switch S2B' to the terminal Vcm. Each of the three sets Array_Vin, Array_−Vref and Array_GND could theoretically include a single capacitor having a capacitance equal to the sum of the capacitances of the set 10'. The embodiment with six capacitors identical to those of the set 10' is convenient, however, because this gives a better approximation to the desired equality. In this connection, it should be noted that the variability of the manufacturing parameters for a capacitor in an integrated circuit is such that its exact capacitance cannot be determined in advance, whereas it is easy to produce capacitors which are approximately identical to each other in the same integrated circuit if they are designed in a identical way.

It should also be noted that, in order to obtain a set Array_−Vref as similar as possible to the set 10' (Array_SAR), it is advisable to form, in series with each capacitor, a closed cut-out switch including a component identical to that used for the switches SW1'–SW6', for example a MOS transistor biased to conduct. In this way, the same resistances, in other words the internal resistances of the components acting as switches, will be present in series with the capacitors of the two sets. Similarly, it is advisable for the connection of the set Array_GND to the ground to take place through a closed cut-out switch including a component identical to that used for the switch S1A'.

The operation of the A/D converter according to the invention as shown in FIG. 3 will now be considered. For the purpose of guidance, we shall assume a supply voltage to the comparator 13' of 2.7 V (relative to ground), a common-mode reference voltage Vcm of 1.35 V, differential reference voltages of ±1 V with respect to the voltage Vcm and an analog input voltage variable from 0 V (ground) to 2 V.

The charging of the set 10' of capacitors, indicated by Array_SAR, for sampling the input voltage Vin is carried out indirectly by the previous charging of the set Array_Vin. In the initial phase, the switch S1A' and the cut-out switch S2A' are in the positions in which the capacitors of the set Array_Vin are charged between Vin and Vcm, and the switches SW1'–SW6' of the set Array_SAR are in the positions in which all the capacitors are connected to the terminal −Vref. The cut-out switch S2B' is operated in synchronization with the cut-out switch S2A', and is initially in the position in which the terminal NS− is at the common-mode voltage Vcm.

In the subsequent phase, the cut-out switches S2A' and S2B' are opened, and immediately afterwards the switch S1A' is brought from the Vin position to the ground position. Consequently, the terminal NS+ which was at the voltage Vcm is brought to Vcm−Vin/2. The terminal NS− remains at Vcm. At this point, the phase of conversion by the SAR process starts according to the criterion summarized above with reference to FIG. 1.

It may be seen that, although the input is single-ended and the structure of the circuit is not symmetrical as it is in the differential converter shown in FIG. 2, the results, in respect of noise immunity, are at least equal to those obtainable with the differential converter. This is because any common-mode noise of the reference voltages +Vref and −Vref due to disturbances in the power supply of the circuit generating these voltages, typically a differential amplifier (not shown), do not affect the voltage difference between the inputs of the comparator 13', owing to the presence of the set Array_−Vref which passes on to the inverting terminal of the comparator 13' the variations which appear on the non-inverting terminal. Furthermore, the two sets Array_Vin and Array_GND connected, during the SAR conversion phase, between the ground terminal and each of the input terminals of the comparator 13', send any disturbances present on the ground terminal in common mode to the inputs of the comparator 13'. These disturbances, therefore, do not affect the output of the comparator 13'. It should also be noted that the phenomena (feed-through) associated with the opening of the cut-out switches S2A' and S2B' are cancelled in common mode, since the discharges of the capacitances associated with the cut-out switches take place to both NS+ and NS−, and that the disturbances on Vcm are stored in common mode in the same way.

Figure 4:
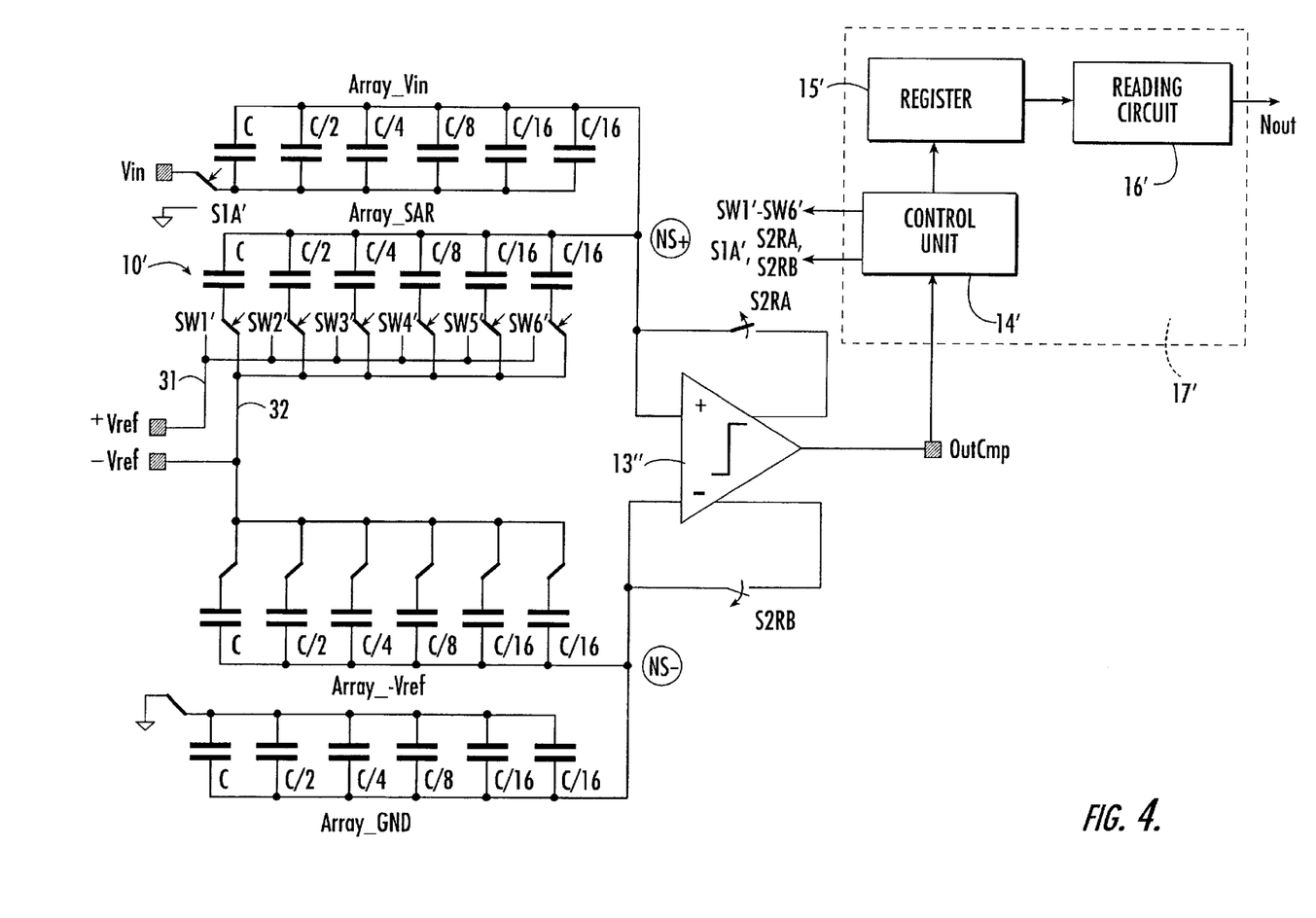
FIG. 4 shows a second embodiment of the invention.

The embodiment shown in FIG. 4, where elements identical to those in FIG. 3 are indicated by the same reference numbers, makes it possible to dispense with a common-mode voltage (Vcm) reference source, since this voltage is generated by the comparator 13" itself. In practice, this is an operational amplifier with differential output (fully-differential amplifier) which has two cut-out switches S2RA and S2RB between the differential inputs and outputs. This configuration of the comparator, which in itself is known, is used to cancel the offset of the comparator by closing the two cut-out switches simultaneously. When the two cut-out switches are closed, the inputs of the comparator, and therefore the nodes NS+ and NS−, are forced to the common-mode reference voltage Vcm of the comparator. By suitable design of the comparator, this voltage is set to the desired value for the correct charging of the set of capacitors 10'. It should be noted that the cut-out switches S2RA and S2RB, which are operated according to the same time program as the cut-out switches S2A' and S2B' in FIG. 3, are closed only during the charging phase, while they are open during the SAR conversion phase.

The examples described above clearly demonstrate the advantages which are obtained by the invention. A single-ended signal can be converted with the maximum accuracy because the converter is insensitive to any disturbances in the power supply source and in the reference potential sources, as in the case of the conversion of a differential signal. This is achieved without using additional circuits and therefore without expenditure of energy. In particular, in the second embodiment, shown in FIG. 4, the energy saving is even greater, owing to the fact that no special circuit is required to generate the common-mode reference voltage. In this case, there is also a saving in the area of the integrated circuit which compensates for the greater use of area required for the sets of supplementary capacitors.

It is also clear to the person skilled in the art that the teachings obtained from the reading of the examples of embodiment of the invention described above may be applied with the same, or greater, advantages to embodiments of A/D converters using sampling with numbers of bits greater than five, for example those using the known technique of separating the capacitances into "Array Upper" and "Array Lower" which makes it possible to interrupt the exponential growth of the value of the capacitances.

That which is claimed is:

1. An analog-digital (A/D) converter for converting an analog signal to a digital signal, comprising:
    a set of sampling capacitor s each having first and second terminals, and at least partially weighted according to a binary code, the first terminals being connected to a common node;
    a plurality of switches each being associated with a respective sampling capacitor, each switch selectively connecting the second terminal of the respective sampling capacitor to one of first and second reference potentials;
    a comparator having first and second inputs and an output, the first input being connected to the common node;
    a first capacitive unit having a first terminal connected to the common node, and a second terminal;
    a charging switch for selectively connecting the second terminal of the first capacitive unit to one of an analog signal source and a third reference potential;
    a first cut-out switch connected between the common node and a fourth reference potential;
    a second cut-out switch connected between the second input of the comparator and the fourth reference potential;
    a second capacitive unit connected between the second input of the comparator and the third reference potential;
    a third capacitive unit connected between the second input of the comparator and the second reference potential; and
    a processing, control and register unit connected to the output of the comparator, and for operating the plurality of switches associated with the sampling capacitors, the charging switch and the first and second cut-out switches according to a predetermined timing program and based upon the output of the comparator, to store positions of the plurality of switches associated with the sampling capacitors and to output the digital signal based upon the analog signal to be converted.

2. An A/D converter according to claim 1, further comprising:
    a first reference source providing the first and second reference potentials; and
    a second reference source providing the fourth reference potential.

3. An A/D converter according to claim 1, wherein said comparator includes circuit portions generating the fourth reference potential.

4. An A/D converter according to claim 1, wherein each of the first, second and third capacitive units comprises a set of capacitors, substantially identical to those of the set of sampling capacitors, and connected in parallel with each other.

5. An A/D converter according to claim 4, further comprising:
    a plurality of closed switches each being associated with a respective capacitor of the capacitors of the third capacitive unit, and each having approximately a same internal resistance as each of the plurality of switches associated with the capacitors of the set of sampling capacitors; and
    a closed switch connecting the second capacitive unit to the third reference potential and having approximately a same internal resistance as the charging switch.

6. An analog-digital (A/D) converter for converting an analog signal to a digital signal, comprising:
    a plurality of sampling capacitors each having first terminals connected to a common node;
    a plurality of switches each being associated with a respective sampling capacitor, each switch selectively connecting a second terminal of the respective sampling capacitor to one of first and second reference potentials;
    a comparator having first and second inputs and an output, the first input being connected to the first terminals of the plurality of sampling capacitors;
    a first capacitive unit having a first terminal connected to the common node, and a second terminal;
    a charging switch for selectively connecting the second terminal of the first capacitive unit to one of an analog signal source and a third reference potential;
    a first switch connected between the common node and a fourth reference potential;
    a second switch connected between the second input of the comparator and the fourth reference potential;
    a second capacitive unit connected between the second input of the comparator and the third reference potential;
    a third capacitive unit connected between the second input of the comparator and the second reference potential; and
    a processor connected to the output of the comparator, and for operating the plurality of switches associated with the sampling capacitors, the charging switch and the first and second switches according to a predetermined timing program and based upon the output of the comparator, to store positions of the plurality of switches associated with the capacitors and to output the digital signal based upon the analog signal to be converted.

7. An A/D converter according to claim 6, wherein the plurality of sampling capacitors are at least partially weighted according to a binary code.

8. An A/D converter according to claim 6, further comprising:
    a first reference source providing the first and second reference potentials; and
    a second reference source providing the fourth reference potential;
    wherein the third reference potential is ground.

9. An A/D converter according to claim 6, wherein the fourth reference potential is a common-mode reference voltage of the comparator.

10. An A/D converter according to claim 6, wherein each of the first, second and third capacitive units comprises a set of capacitors, substantially identical to those of the plurality of sampling capacitors, and connected in parallel with each other.

11. An A/D converter according to claim 10, further comprising:
- a plurality of closed switches each being associated with a respective capacitor of the third capacitive unit, and each having approximately a same internal resistance as each of the plurality of switches associated with the set of sampling capacitors; and
- a closed switch connecting the second capacitive unit to the third reference potential and having approximately a same internal resistance as the charging switch.

12. A method of converting an analog signal to a digital signal, comprising:
- connecting first terminals of a plurality of sampling capacitors to a common node;
- selectively connecting a second terminal of each of the respective sampling capacitors to one of first and second reference potentials via a plurality of associated switches;
- connecting the common node to a first input of a comparator;
- connecting a first terminal of a first capacitive unit to the common node;
- selectively connecting a second terminal of the first capacitive unit to one of an analog signal source and a third reference potential via a charging switch;
- selectively connecting the common node to a fourth reference potential via a first switch;
- selectively connecting the second input of the comparator to the fourth reference potential via a second switch;
- connecting a second capacitive unit between the second input of the comparator and the third reference potential;
- connecting a third capacitive unit between the second input of the comparator and the second reference potential;
- operating the plurality of associated switches, the charging switch and the first and second switches according to a predetermined timing program and based upon the output of the comparator;
- storing positions of the plurality of associated switches; and
- outputting the digital signal.

13. A method according to claim 12, further comprising at least partially weighting the plurality of sampling capacitors according to a binary code.

14. A method according to claim 12, further comprising:
- providing the first and second reference potentials via a first reference source; and
- providing the fourth reference potential via a second reference source;
- wherein the third reference potential is ground.

15. A method according to claim 12, wherein the fourth reference potential is a common-mode reference voltage of the comparator.

16. A method according to claim 12, wherein each of the first, second and third capacitive units comprises a set of capacitors, substantially identical to those of the plurality of sampling capacitors, and connected in parallel with each other.

17. A method according to claim 16, further comprising:
- providing a plurality of closed switches each being associated with a respective capacitor of the third capacitive unit, and each having approximately a same internal resistance as each of the plurality of switches associated with the set of sampling capacitors; and
- providing a closed switch connecting the second capacitive unit to the third reference potential and having approximately a same internal resistance as the charging switch.

* * * * *

UNITED STATES PATENT AND TRADEMARK OFFICE
CERTIFICATE OF CORRECTION

PATENT NO.     : 6,433,724 B1
DATED          : August 13, 2002
INVENTOR(S)    : Pierangelo Confalonieri, Angelo Nagari and Alessandro Mecchia It is certified that error appears in the above-identified patent and that said Letters Patent is hereby corrected as shown below:

<u>Title page,</u>
Item [73], Assignee, delete "STMicroelectronics S.R.L." insert
-- STMicroelectronics S.r.l. --
Item [56], References Cited, insert:
-- FOREIGN PATENT DOCUMENTS
JP         63300627         7/12/02 --

<u>Column 1,</u>
Line 59, delete "and are" insert -- are --

<u>Column 5,</u>
Line 39, delete "a" insert -- an --

<u>Column 7,</u>
Line 17, delete "capacitor s" insert -- capacitors --

Signed and Sealed this

Twenty-fifth Day of March, 2003

JAMES E. ROGAN
*Director of the United States Patent and Trademark Office*